United States Patent
Wang et al.

(10) Patent No.: US 7,652,531 B2
(45) Date of Patent: Jan. 26, 2010

(54) LOW COST HIGH PERFORMANCE POWER AMPLIFIER UTILIZING TWO-STAGE-INCLUDED LOCAL NEGATIVE FEEDBACK WITH FEEDBACK-SHIFTING TECHNOLOGY

(75) Inventors: Zhenwu Wang, 555 Laurie La., Apt. F5, Thousand Oaks, CA (US) 91360; Dong An, Cupertino, CA (US); Huixing Jin, Thousand Oaks, CA (US)

(73) Assignee: Zhenwu Wang, Thousand Oaks, CA (US)

( * ) Notice: Subject to any disclaimer, the term of this patent is extended or adjusted under 35 U.S.C. 154(b) by 44 days.

(21) Appl. No.: 12/040,915

(22) Filed: Mar. 2, 2008

(65) Prior Publication Data

US 2009/0115528 A1 May 7, 2009

Related U.S. Application Data

(60) Provisional application No. 61/001,873, filed on Nov. 3, 2007.

(51) Int. Cl.
*H03F 1/34* (2006.01)

(52) U.S. Cl. .......................... 330/99; 330/100

(58) Field of Classification Search .......... 330/98, 330/99, 100, 107, 109
See application file for complete search history.

(56) References Cited

U.S. PATENT DOCUMENTS 6,353,367 B1 * 3/2002 Chiu .......................... 330/311

* cited by examiner

*Primary Examiner*—Steven J Mottola

(57) ABSTRACT

The present invention provides a cost-effective and power-effective solution to a high performance amplifier design over conventional Class A and Class B/AB amplifiers. Without increasing cost or losing simplification of conventional Class B/AB amplifier configuration, two kinds of unique local feedback loops, which cover the second and third stages and further offer a feedback shifting feature over frequency range, are disclosed to replace the traditional Miller compensation capacitor to suppress dominant distortion, which is usually generated by the two last stages while maintaining stability of the amplifier, through high frequency end. Since the present invention provides key elements of a three-stage amplifier that enable performance improvement in a wide range of circuit design, the present invention has significant commercial values in amplifier circuit industries including audio power amplifiers, IC (integrated circuit) operational amplifiers, ADC (Analog-to-Digital Conversion) and DAC (Digital-to-Analog Conversion) buffers, etc.

19 Claims, 14 Drawing Sheets

US 7,652,531 B2

LOW COST HIGH PERFORMANCE POWER AMPLIFIER UTILIZING TWO-STAGE-INCLUDED LOCAL NEGATIVE FEEDBACK WITH FEEDBACK-SHIFTING TECHNOLOGY

CROSS REFERENCE OF RELATED APPLICATION

This is a regular application of a provisional application having an application No. 61/001,873 and a filing date of 3 Nov. 2007.

BACKGROUND OF THE PRESENT INVENTION

1. Field of the Present Invention

The present invention relates in general to solid state electronic amplifiers, and more particularly to low cost audio power amplifiers with ultra low distortion and high power efficiency performance for audio systems. The present invention further relates to a method of using two kinds of new local Negative Feedback (NFB) networks to replace the traditional Miller compensation capacitor used in various amplifier circuits, including most commonly used IC (integrated circuit) operational-amplifiers, for improving the performance of amplifiers over the extended frequency band which users have the most interest in and put growing emphases on for their applications.

2. Description of Related Arts

An electronic amplifier is employed to make signals stronger in terms of voltage, or current, or power (both voltage and current). Conventional solid state amplifier circuits, including most audio power amplifier units (discrete or hybrid) and most integrated operational amplifiers, excluding some on-chip CMOS operational amplifiers which only have capacitive loading and don't need current drivability, despite of their power handling scales, all have emitter/source follower output stages and utilize the three-stage architecture as shown in FIG. 1. The first stage is a trans-conductance amplifier (voltage in—current out), followed by a trans-impedance amplifier (current in—voltage out) in the second stage (which provides the main voltage gain for the whole amplifier) and a voltage follower in the third stage which is a unity gain current amplifier and is usually configured by emitter/source follower pairs to drive a load. An ideal amplifier should linearly increase the strength of the input signals only in both voltage and current without adding any extra components, by using 100% power taken from a power supply. However, a real-world amplifier can not ideally achieve the performance of distortion-free and 100% power efficiency. Since IC operational amplifiers only differ from audio power amplifiers in the output power scale while their circuit topology and functionality are almost identical, only audio power amplifiers are presented hereafter for simplicity. However, all the facts and conclusions for audio power amplifiers mostly remain true for IC operational amplifiers unless specified.

The classification of a power amplifier usually depends on the biasing of the amplifier's output stage. Although Class D power amplifier reveals a new design technology and is getting attention for its high power efficiency in audio products, it still suffers from various problems like possible EMC (Electromagnetic Compatibility) emission issues and design difficulties due to its strong performance dependence on device characteristics. Class D power amplifier is also not suitable for high quality home audio products since it has to drive separate speaker systems which hardly have the required impedance characteristics. Therefore, most home audio amplifiers still use traditional design and the output stage of an audio power amplifier is usually biased at Class A, Class B, or Class AB. When the output stage is biased at Class B or Class AB for a compromise between performance and power/cost efficiency, total distortion of the three stages is usually dominated by the distortion generated by the last stage if the first and second stages are carefully designed. The last stage distortion results from two reasons: the power transistors alternative switching-on and switching-off functions during the full input signal cycle and the heavily curved V-I transfer function of the transistors in the small signal vicinity. The distortion is called crossover distortion and strongly quiescent bias current dependent. The output stage's crossover distortion is one of the most daunting distortions in audio power amplifiers, since it generates high order harmonics which significantly degrade sound/music reproduction quality even if it is not the dominant part among the whole distortion. Badly, the crossover distortion tends to increase when the output level drops, further worsens amplifiers' real performance since the volume most people listen is modest. Solid state power amplifiers have long been blamed for not sounding as smoothly and warmly as vacuum tube amplifiers and generating so called "transistor sound" by some audiophiles, which is believed highly due to the crossover distortion which intrinsically associates with Class B and Class AB amplifiers.

A common and effective way for reducing the crossover distortion and also improving other performance is to employ overall negative feedback (NFB). Almost all audio power amplifiers use overall NFB to achieve targeted performance, as illustrated in FIG. 1. As we all know, for a practical amplifier, we also need to implement compensation to retain stability when overall NFB is implemented. The most commonly used compensation technique is to add a Miller compensation capacitor to the second stage, as the $C_f$ shown in FIG. 1 and the $C_1$ shown in FIG. 2. Miller compensation capacitor is a small capacitor (10s of PF to 100 pF) that is connected between the input node and the output node of the second stage (which can be either a single common-emitter BJT amplifier or a cascoded common-emitter common-base BJT pair, or their MOSFET counterparts). The Miller compensation dramatically pulls the dominant pole towards the low frequency region (and also moves the second pole to higher frequency region as so called "pole-splitting"), so that the open loop gain at high frequency gets greatly reduced and hence the overall NFB won't cause stability problem. The Miller compensation actually provides a local feedback loop around the second stage so that its distortion and drivability is improved. The enhanced drivability of the second stage can also help reduce the third stage's crossover distortion somewhat, though this is only a subsidiary effect and far less adequate. Since the major distortion contributor, the output stage, stays outside of the local Miller NFB loop, further crossover distortion reduction only relies on the overall NFB. On the other hand, since the Miller compensation forms the dominant pole at a frequency point ranging from 10s of Hz to several kHz, the open loop gain begins to roll off from this low frequency and leaves much less NFB available to linearise the output stage (and the other stages as well) at higher frequencies, as illustrated in FIG. 3. This is the reason why conventional power amplifiers have bigger distortion at high frequency band. Almost all existing power amplifiers suffer from higher distortion from a frequency point through 100s of Hz to several kHz. Although it appears that lower distortion could be achieved with larger overall NFB by increasing open loop gain, however, larger overall NFB can reduce distortion at low frequency only, not efficiently at high frequency. This is because with a higher open loop gain, though more NFB can be implemented, more compensation is also needed accordingly. As a result, the dominant pole becomes lower and the open loop gain begins rolling off earlier, leaving the available NFB barely changed above the rolling-off frequency. Therefore, it is impossible to rely on overall NFB to further reduce distortion at high frequencies. On the contrary, modern audio power amplifiers tend to use overall NFB as little as possible to avoid or minimize TIM (Transient Intermodulation) distortion. TIM happens when the amplifier's slew rate is too low to follow fast pulse input. The slew rate is normally limited by the possible maximum slew current and the capacitance of the Miller capacitor. With the same slew current (which is usually close to the total bias current of the input stage), the bigger the Miller compensation capacitor, the lower the slew rate. With heavy overall NFB, bigger Miller compensation capacitor is inevitable and therefore the slew rate is further limited. So, increasing overall NFB is also not preferable when TIM distortion is concerned.

In order to achieve low distortion over the whole audio frequency range, the simplest solution to further reduce the output stage associated cross-over distortion is to increase its quiescent biasing current. The ultimate low distortion design is to bias the output stage at Class A, i.e., the upper/lower transistor pair constantly has current flow through in the full input signal cycle hence there is no switching operation and the upper/lower transistor pair works at a much more linear region. Combined with well designed input and driver stages, Class A audio power amplifier can achieve as low as 0.002% distortion from low frequency through 20 KHz. However, Class A power amplifiers have obvious drawbacks: it is very power inefficient, and since the output stage consumes the biggest power at idling, it generates large amount of heat. Therefore, a big heatsink is usually inevitable for Class A power amplifiers, which makes Class A power amplifiers bulky, heavy, and highly expensive. In addition to these disadvantages, Class A amplifiers, including highly biased Class AB amplifiers, need careful thermal design to prevent the hot output transistors from thermal runaway, which is especially true for BJT output devices since these devices normally have positive temperature coefficient. In order to reduce the power consumption while achieving performance equal to or close to what Class A amplifiers provide, intensive researches have been done in the past. One of the proposed solutions is to actively bias the final stage so that the power transistors never turn off, i.e., the upper/lower emitter/source follower transistors always have current flow through in either positive or negative input signal cycle so that it avoids the switching operation. Although this method can eliminate the switching associated distortion, it still suffers from the distortion associating with the curved V-I transfer function at small signal level. In addition, the active bias causes the concern of extra distortion due to the bias circuit since it is input related. Another idea is to adjust the power supply voltage level for the output stage in accordance with the input signal level and that the output transistors are biased at Class A with an input dependent varying power supply voltage, so that power consumption can be kept relatively low. This methods could improve the power efficiency while achieving Class A (or near Class A) performance. However, additional power circuit is needed to promptly adjust the power supply voltage for the output stage, which not only increases circuit complexity and cost, but also leads to the concern of the extra power consumption. There are also other approaches proposed to achieve low distortion for power amplifiers other than setting the final stage working at Class A biasing. One example is to use two amplifiers: one is high power/poor performance and the other is low power/high performance. The two outputs of the two amplifiers are summed through a well calculated network bridge, so that the distortion can be cancelled and hence only the pure amplified signal goes to the load. In order to achieve zero or very low distortion, a set of conditions need to hold true over all the frequency range and all the operational environments. However, in real-world practical applications, the variation of devices' aging parameters over life time and environments would make it difficult for the conditions to be maintained for all life time of the product. Also, this approach uses two amplifiers and the circuit is much more complicated, as compared to conventional designs.

Therefore, it is still a challenging task to design a crossover distortion free, low cost, light weight and power efficient power amplifier with existing technologies for commercial applications.

SUMMARY OF THE PRESENT INVENTION

An objective of the present invention is to provide a novel power amplifier design technique wherein a Two-Stage-Included local negative feedback is introduced to greatly reduce the crossover distortion and achieve a superior performance which is equivalent to or even better than that a Class A amplifier can offer, with its circuit complexity, power consumption and cost levels hardly changed from its conventional counterpart of Class B/AB amplifier. A well designed power amplifier with the present invention could achieve less than 0.001% distortion over a frequency range of 20 Hz-20 KHz (entire audio frequency range) at output power from 0.5 Watt to 100 Watt with total biasing current of 50 mA only.

Another objective of the present invention is to disclose two kinds of local negative feedback networks and the associated feedback-shifting technology for almost all three-stage power amplifier designs to replace the conventional Miller compensation for greatly improving the overall performance of the amplifiers over the whole desired frequency range, while achieving similar stability to which the traditional Miller compensation maintains.

In order to accomplish the above objectives, a power amplifier of the present invention for optimally amplifying signals with low distortions in a power efficient way comprises:

(1) A first-stage amplifying module, which serves as a trans-conductance amplifier, receiving a voltage signal from a audio source as input and generating current output;

(2) A second-stage amplifying module, which is a trans-impedance amplifier, receiving the output current from the first-stage amplifying module as input and producing voltage output, wherein the second stage amplifying module also receives a signal from a Two-Stage-Included local NFB network that is connected between the input node of the second-stage and the output node of a third-stage amplifying module. Depending on the type of the network which can be configured as one of the two constructions as described in (4), the Two-Stage-Included local NFB network may also be connected to the output of the second stage, in order to suppress the dominant distortion that is generated by both the second and the third-stage amplifying modules and to maintain the stability of the entire power amplifier;

(3) The third-stage amplifying module, which is a unity gain voltage follower and could be emitter or source follower pair, or Darlington transistor pair, to provide current gain and acts as the output stage of the entire power amplifier to drive a load; and (4) One of the following two new Two-Stage-Included local NFB networks, which is implemented to replace the conventional Miller compensation capacitor:
   a. Network A: A RC (resistor-capacitor) network, which is connected between the input node of the second stage amplifying module and the output node of the third stage amplifying module and provides a local two-stage-included NFB loop which includes the second and the third stage amplifying modules, is to reduce any distortion generated by these two stage amplifying modules, while achieving stability performance close to Miller compensation;
   b. Network B: A RCC (resistor-capacitor-capacitor) or RCCL (resistor-capacitor-capacitor-inductor) network, which is connected between the input node of the second-stage amplifying module, the output node of the second-stage amplifying module and the output node of the third stage amplifying module, is to provide a local feedback-shifting mechanization. As disclosed later in more detail, the local feedback-shifting technology of the present invention is to provide the desired two-stage-included local feedback from low frequency to a high frequency point and then the Two-Stage-Included local NFB networks shifting back to traditional Miller compensation at even higher frequencies. This network B can benefit greatly from the two-stage-included local NFB in the most important operational frequency band while achieving almost identical stability performance as Miller compensation in the higher frequency outside of the operational band, and provides virtually immediate implementation and low cost retrofit in any existing three stage amplifier designs for performance improvement.

DETAILED DESCRIPTION OF THE PREFERRED EMBODIMENT

Figure 4:
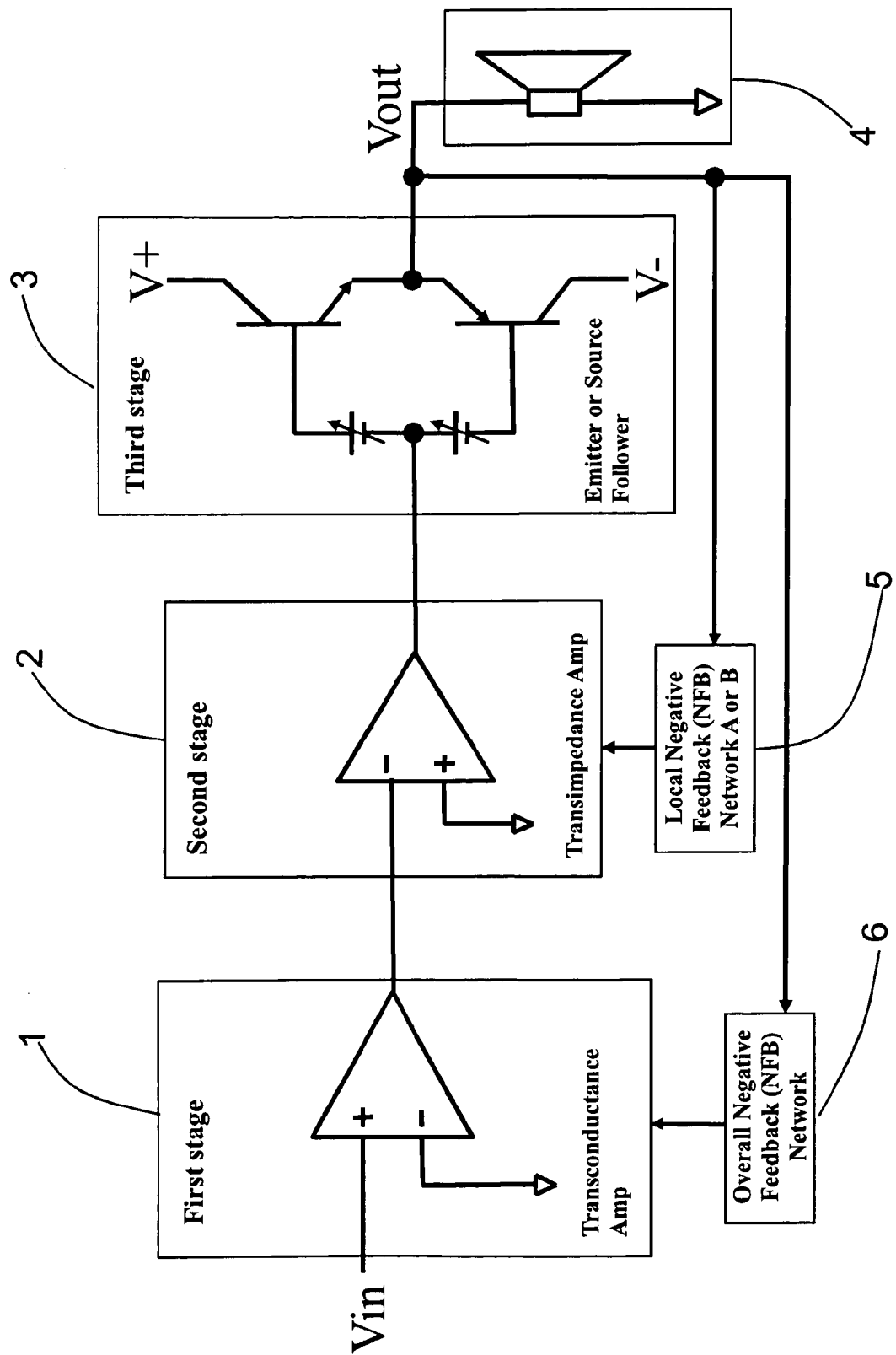
FIG. 4 is a block diagram illustrating the power amplifier according to a preferred embodiment of the present invention.

A power amplifier of the present invention maintains the traditional three-stage amplifying framework and further introduces two unique Two-Stage-Included local Negative Feedback (NFB) mechanizations to achieve exceptional performance at virtually no extra material and manufacturing cost. Referring to FIG. 4, a power amplifier of the present invention comprises the following three-stage amplifying modules and one of the two kinds of new local NFB networks (denoted as local NFB network A and local NFB network B, respectively) as well:

(1) A first stage amplifying module 1, which serves as a local trans-conductance amplifier, receiving a voltage input signal at one of its two input nodes and a overall NFB signal from a overall negative feedback network 6 that is connected between the other input node of the first-stage amplifying module 1 and the output node of a third stage amplifying module 3, and providing a current signal as output;

(2) A second stage amplifying module 2, which is a local trans-impedance amplifier, receiving the current signal from the output of the first-stage amplifying module 1 and producing voltage output, wherein the second-stage amplifying module 2 also receives a local NFB signal from a local negative feedback network 5 which could be either connected between the input of the second-stage amplifying module 2 and the output of the third-stage amplifying module 3, or also connected to the output of the second-stage module 2 as well, depending on its type. The local NFB provided by the local NFB network 5 suppresses the dominant distortion that is generated by both second stage amplifying module 2 and the third-stage amplifying module 3 and maintains the stability of the entire amplifier; and (3) The third stage amplifying module 3, which is a unity gain voltage follower and could be emitter or source follower, or Darlington transistor pair, providing current gain and acting as the output stage of the entire power amplifier to drive a load 4.

Figure 5:
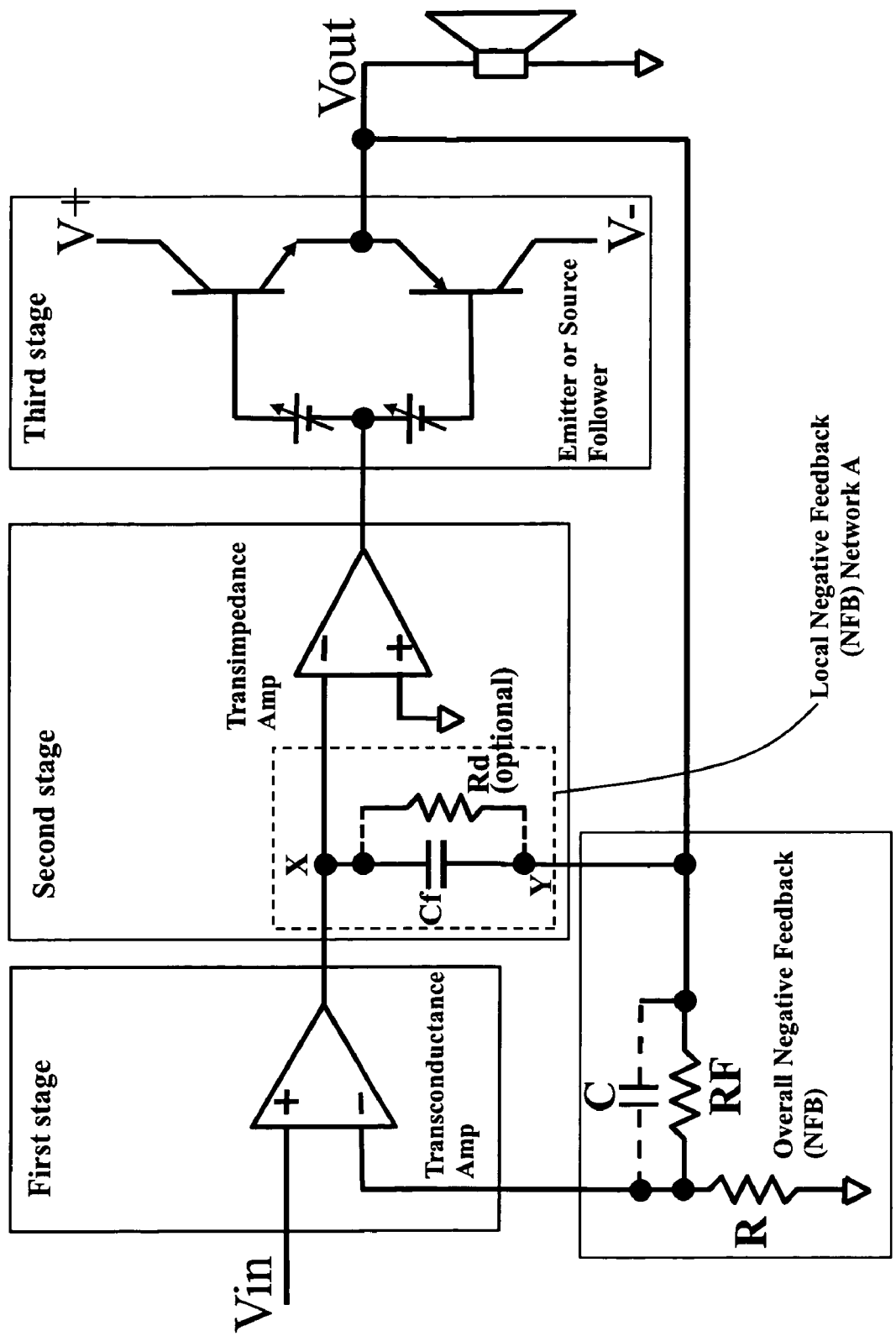
FIG. 5 is a block diagram illustrating the configuration of the power amplifier with the first preferred local NFB network (Network A) of the present invention.

As one preferred embodiment of the present invention, the first preferred local NFB network 5 of the present invention, denominated as local NFB network A, is formed by resisters and capacitors (a RC network) for the second and third stage amplifying modules. As shown in FIG. 5, the local NFB network can be formed by a resistor and an optional capacitor which are connected in parallel between the input node of the second-stage amplifying module and the output node of the third-stage amplifying module. Since the output stage, the third-stage amplifying module, is inside the local feedback loop, the distortion associated with the last stage amplifying module can be effectively reduced, and this is especially true when the last stage amplifying module (the third-stage amplifying module) is biased at Class B/AB. Since the RC network forms a local Voltage-Current feedback (i.e., sensing output voltage and feeding current to input), it reduces the input and output impedances of the second stage and third stage combined circuit, respectively. This is desirable: since a lower input impedance of the second stage amplifying module (with third stage amplifying module combined) will reduce the voltage gain of the first stage amplifying module hence reduce the voltage variation at the input node of the second stage amplifying module, therefore, it helps reduce the distortion associated with the first stage amplifying module; and the lower output impedance of the third stage amplifying module is also preferable for a power amplifier since it usually drives a complicated load like a speaker system and a lower output impedance always helps. With this local NFB loop, the present invention establishes a virtually ideal way of transferring overall NFB into local NFB: with the quantity we lose on the overall gain due to the local NFB, we gain the same amount of local NFB to improve the performance of the second and third stage amplifying modules.

The following design examples #1 and #2 are summarized to demonstrate the application of the first preferred local NFB network of the present invention. It should be noted that other configurations of the three-stage amplifying modules can be used in the practice of the first preferred local NFB network of the present invention and the present invention is not limited to the specific configurations of the three-stage amplifying modules described herein as preferred embodiments.

EXAMPLE 1

Figure 8:
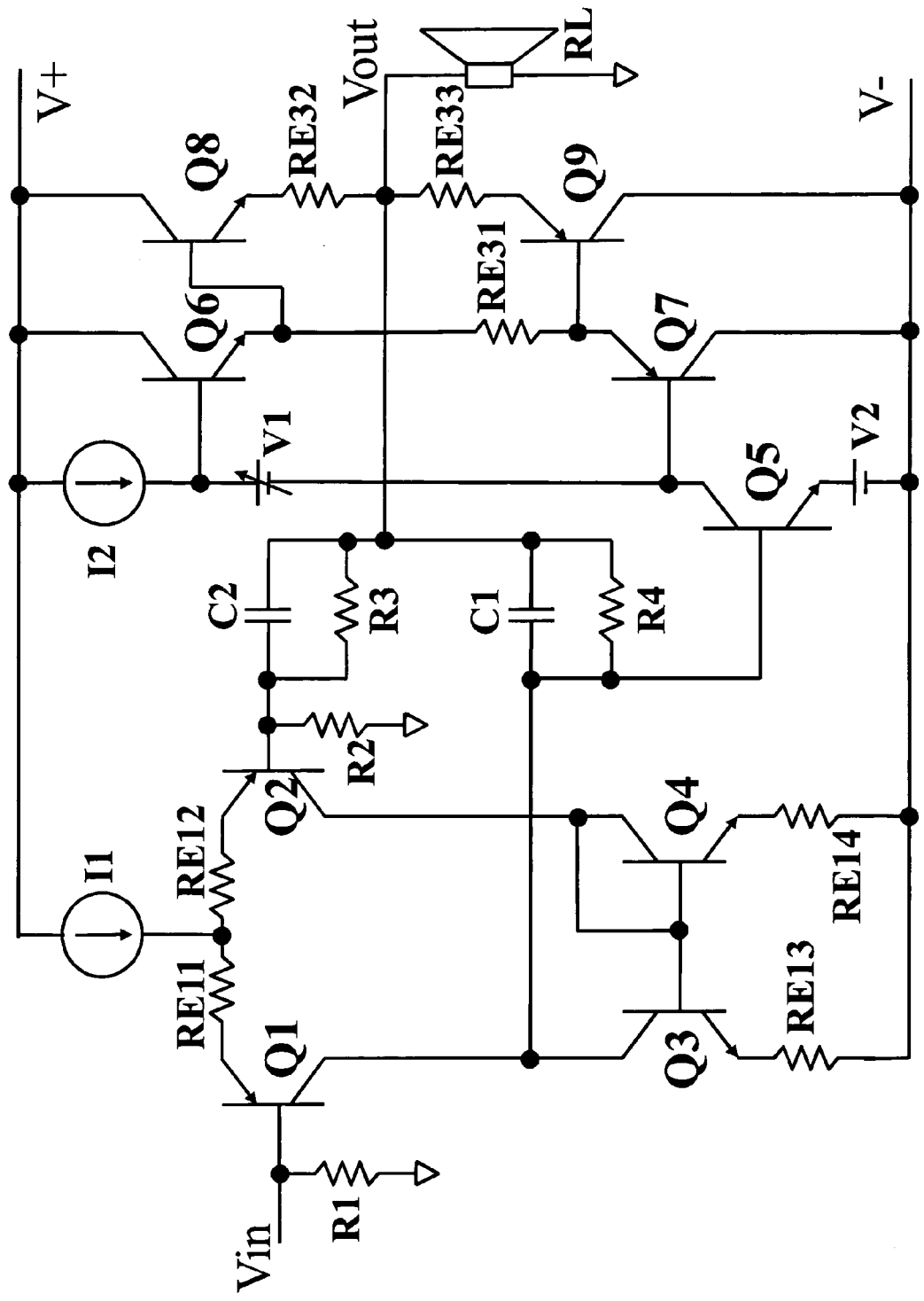
FIG. 8 is a schematic illustrating a basic power amplifier with the first preferred local NFB network (Network A) according to another preferred embodiment of the present invention.

A power amplifier, as shown in FIG. 8, comprises a traditional three stage configuration with overall NFB and has a local NFB network which replaces the conventional Miller compensation, as follows:

(1) The first stage amplifying module is a differential transconductance amplifier which has two voltage input nodes and one current output node and consists of a common-emitter configured transistor pair, Q1 and Q2, two local feedback resisters, RE11 and RE12, a current source, I1, a current mirror configured transistor pair, Q3 and Q4, and the associated emitter resister pair, RE13 and RE14.

(2) The second stage amplifying module is a common-emitter configured single transistor trans-impedance amplifier which has its input node connected to the output node of the first stage amplifying module and its output node connected to the input node of the third stage amplifying module and consists of a transistor, Q5, a voltage shift device V2 which could be a Zener diode, a general purpose diode or a diode-configured transistor, and a current source, I2.

(3) The third stage amplifying module is two consecutively connected emitter-follower pairs which has its input nodes connected to the output node of the second stage amplifying module and its output node to be the output node of the whole amplifier and drive a load and consists of two complimentary transistor pairs, Q6/Q7 and Q8/Q9, a bias voltage generator, V1, and three emitter resistors, RE31, RE32 and RE33.

Figure 1:
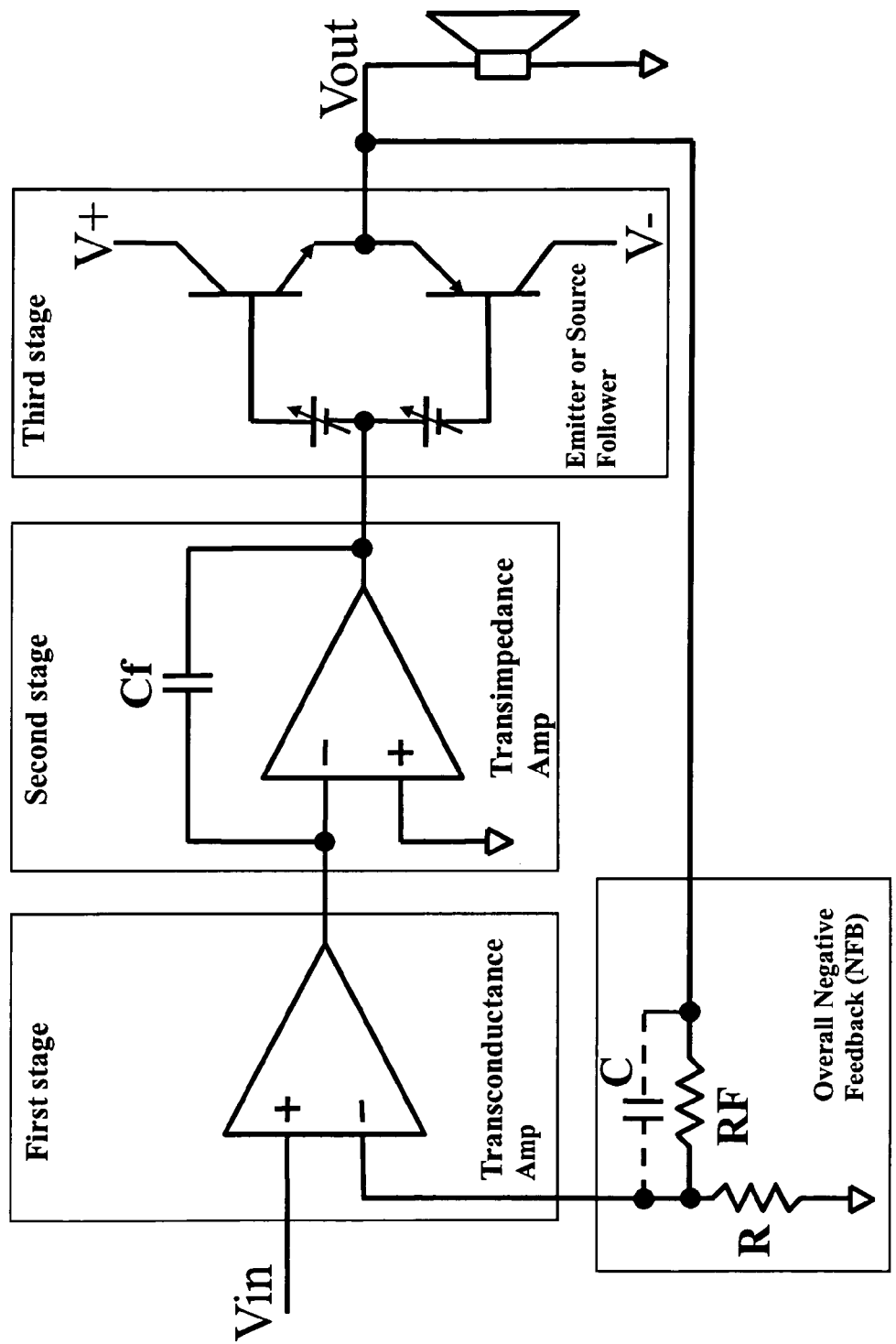
FIG. 1 is a block diagram illustrating the configuration of a conventional power amplifier.
Figure 2:
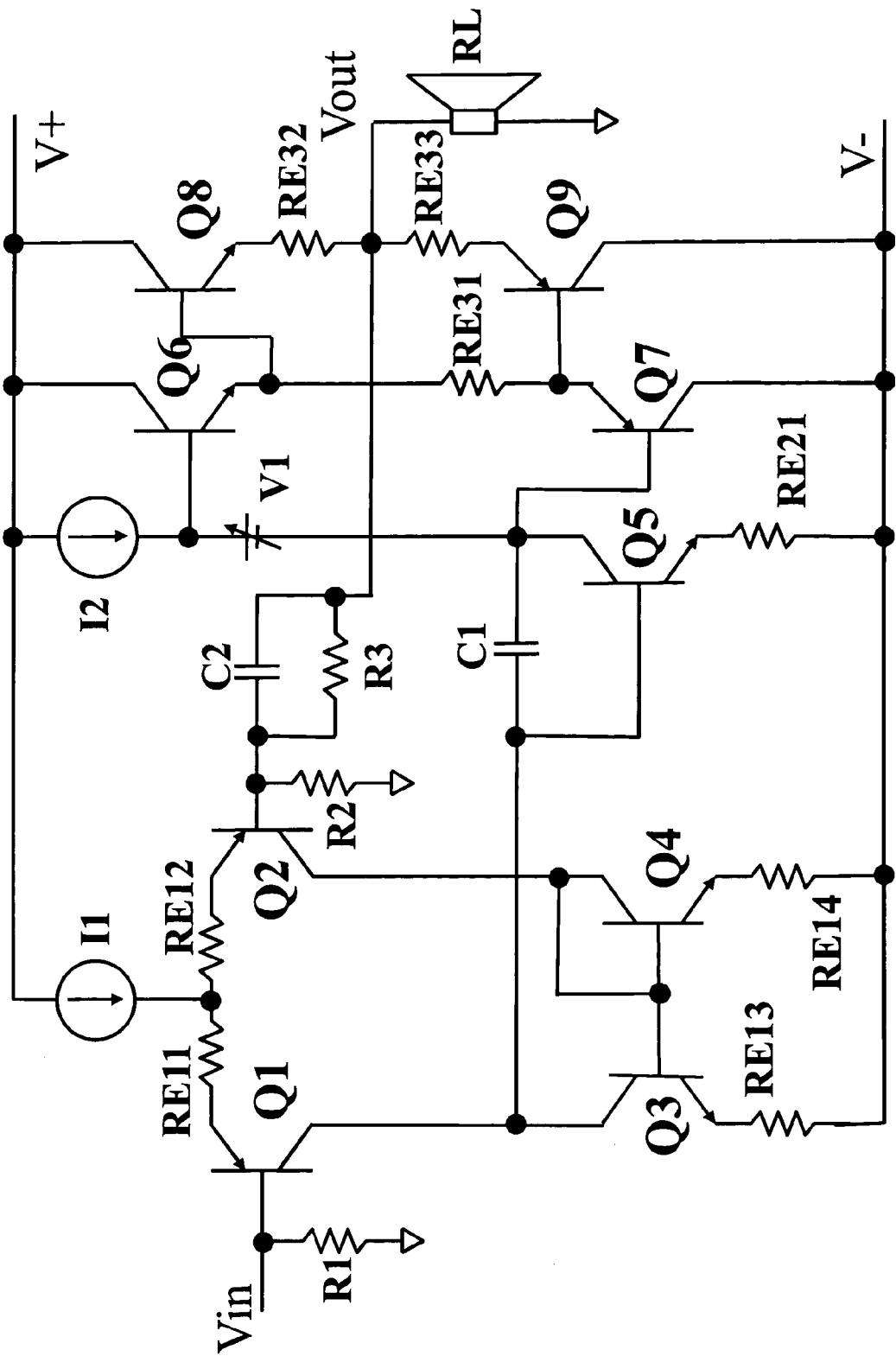
FIG. 2 is a schematic illustrating a basic conventional power amplifier circuit.
Figure 3:
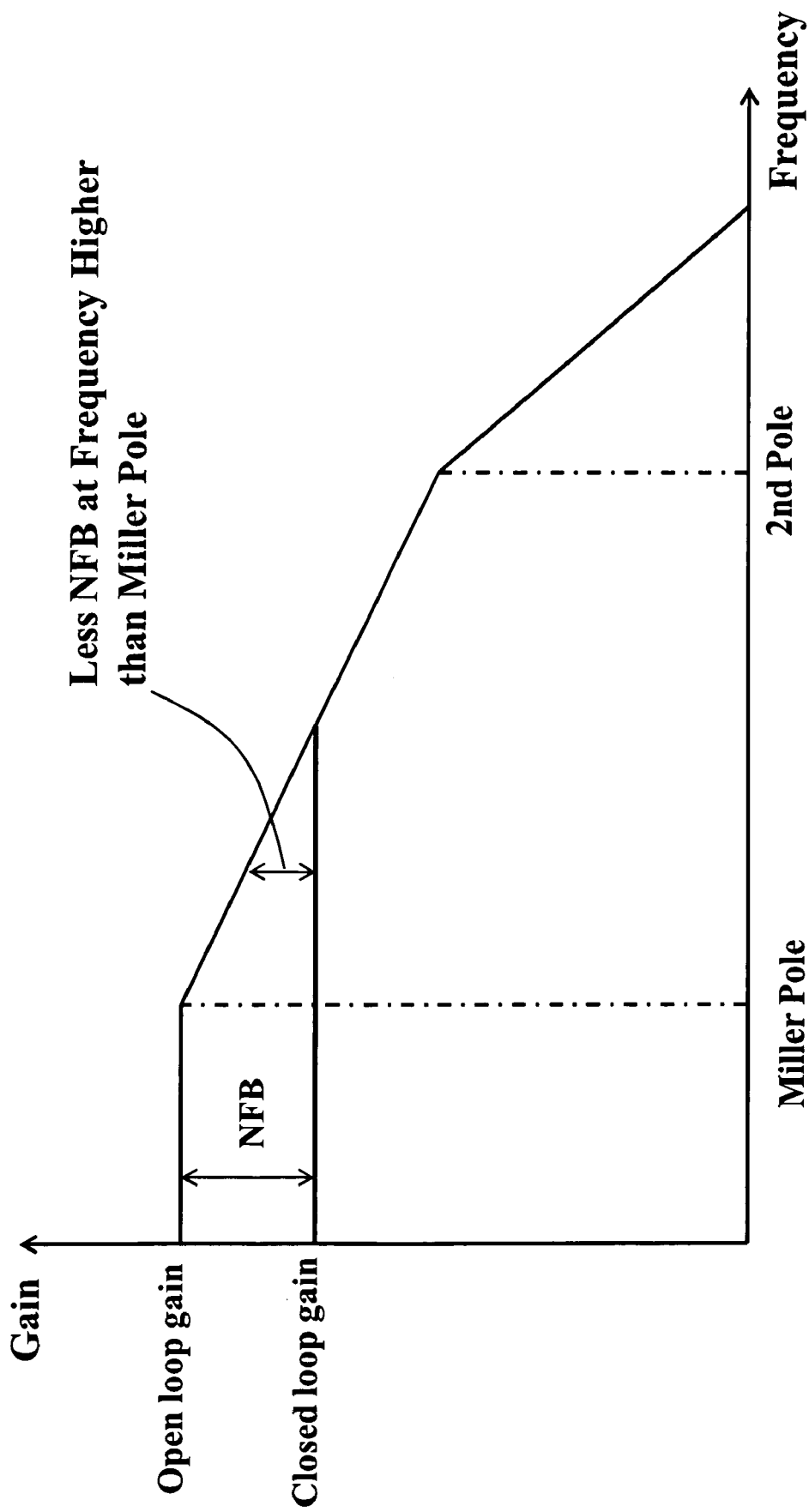
FIG. 3 is a curve illustrating the relationship of Miller Pole and NFB.

(4) A local NFB network A is inserted between the input of the second stage amplifying module and the output of the third stage amplifying module, which is comprised of a resister, R4, and a capacitor, C1, connected in parallel. As compared with the conventional design as shown in FIG. 2, this example of the power amplifier of the present invention shown in FIG. 8 introduces a resister connected between the input of the second stage amplifying module and the output of the third stage amplifying module as well as a compensation capacitor in parallel with the resister.

(5) An overall NFB network is inserted between the negative input of the first stage amplifying module and the output of the third stage amplifying module which is comprised of two resistors, R2 and R3, connected in serial, and a capacitor, C2, connected in parallel with R3.

EXAMPLE 2

Figure 10:
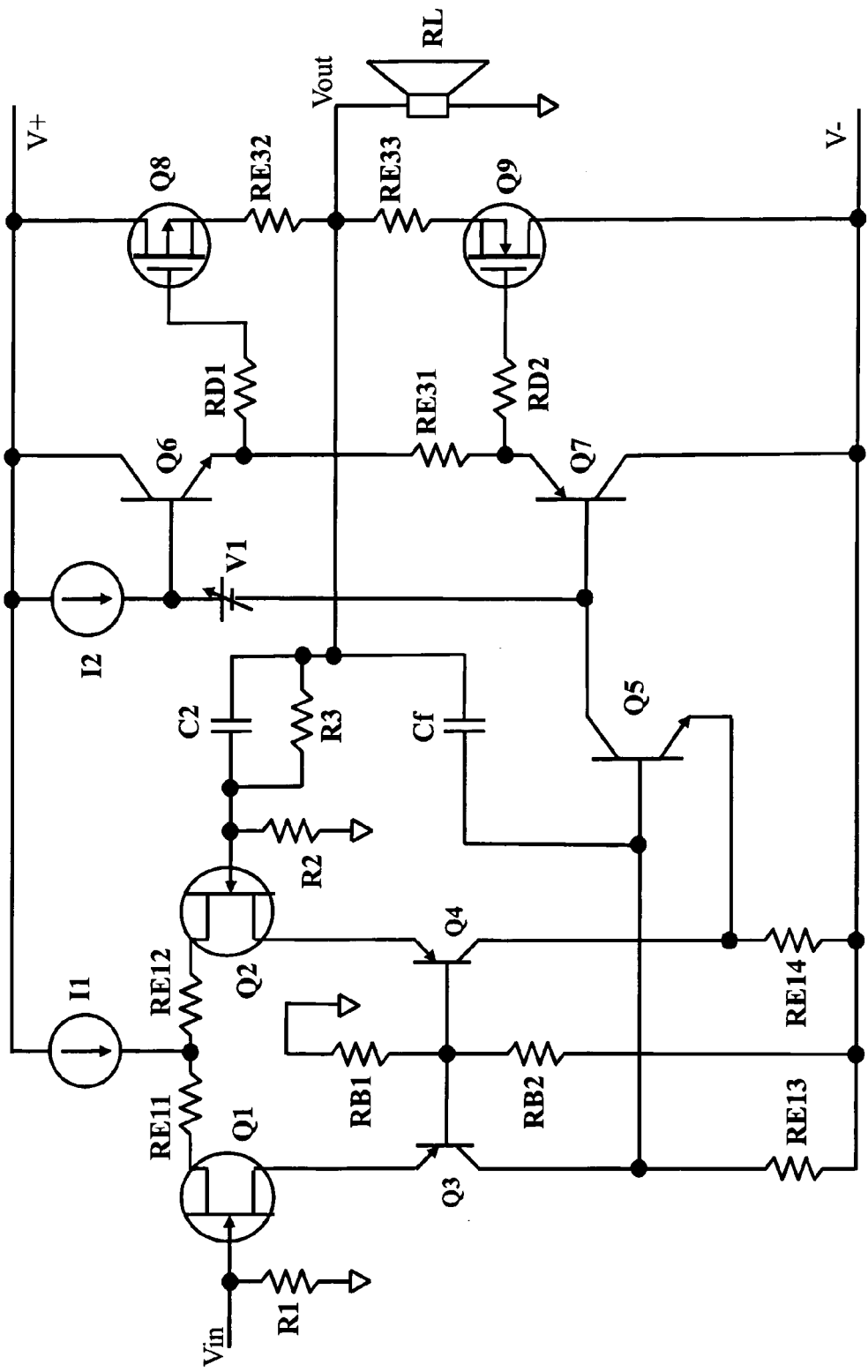
FIG. 10 is a schematic illustrating a simple power amplifier with the first preferred local NFB network (Network A) according to another preferred embodiment of the present invention.

A power amplifier, as shown in FIG. 10, comprises an alternative three stage configuration with overall NFB and has a local NFB network which replaces the conventional Miller compensation, as follows:

(1) The first stage amplifying module is a differential transconductance amplifier which has two voltage input nodes and two current output nodes and consists of a cascaded common-source common-base configured transistor pair, Q1/Q3 and Q2/Q4, two local feedback resisters, RE11 and RE12, a current source, I1, two output load resisters, RE13 and RE14, and two bias resisters, RB1 and RB2.

(2) The second stage amplifying module is a unique common-emitter single transistor trans-impedance amplifier which has its base connected to one of the output nodes of the first stage amplifying module and its emitter connected to the other output node of the first stage amplifying module and has its output node connected to the input node of the third stage amplifying module and consists of a transistor, Q5, and a current source, I2.

(3) The third stage amplifying module is a consecutively connected emitter-follower pair and source-follower MOSFET pair which has its input nodes connected to the output node of the second stage amplifying module and its output node to be the output node of the whole amplifier and drive a load and consists of two complimentary transistor pairs, Q6/Q7 and Q8/Q9, a bias voltage generator, V1, two damping resistors, Rd1 and Rd2, and three emitter resistors, RE31, RE32 and RE33.

(4) A local NFB network A is inserted between the input node of the second stage amplifying module and the output node of the third stage amplifying module which is comprised of one capacitor, Cf.

(5) An overall NFB network is inserted between the negative input node of the first stage amplifying module and the output node of the third stage amplifying module which is comprised of two resistors, R2 and R3, connected in serial, and a capacitor, C2, connected in parallel with R3.

Since the new local NFB network A revealed above covers two stage amplifying modules and has one more stage amplifying module inside the feedback loop, as compared to the tight local feedback loop formed by the traditional Miller compensation which covers the second stage amplifying module only, the stability of an amplifier which utilizes the two-stage-included local NFB could be worse than its counterpart which uses Miller compensation. Practically, if the second and third stage amplifying modules included NFB loop has relatively small loop gain, the amplifier would be stable and the new compensation capacitor of the first preferred local NFB network could remain as small as the Miller compensation capacitor. The new two-stage-included NFB has an advantage over the Miller compensation as follows: the compensation capacitor value virtually doesn't affect the overall high frequency performance when the distortion of the second and third stage amplifying modules dominates. This comes from the following fact: with a bigger compensation capacitor, while the rolling off frequency point decreases and thus causes the open loop gain to drop and therefore leaves less overall NFB at higher frequencies, the local NFB becomes stronger so that the second and third stage amplifying modules performance is further improved, as a result, the high frequency performance loss due to the lower overall NFB is mostly compensated by the enhanced local NFB and finally the total performance is virtually unchanged. Even though, in order to avoid any possible TIM distortion, we still need to keep the compensation capacitor as small as possible. Since now the role of the overall NFB could mostly be replaced by the local NFB, a big open loop gain is no longer a necessary characteristic of a power amplifier. This reveals possibilities of new design methodology. For example, we can trade some open loop gain for the local feedback for the first stage amplifying module to further reduce the possibility of causing TIM distortion. This can be realized by increasing the emitter shunt resisters RE11/RE12, as shown in FIG. 8. Another approach would be utilizing the new two-stage-included local NFB in a NON-OVERALL feedback amplifier design as also disclosed in the present invention later.

Figure 6:
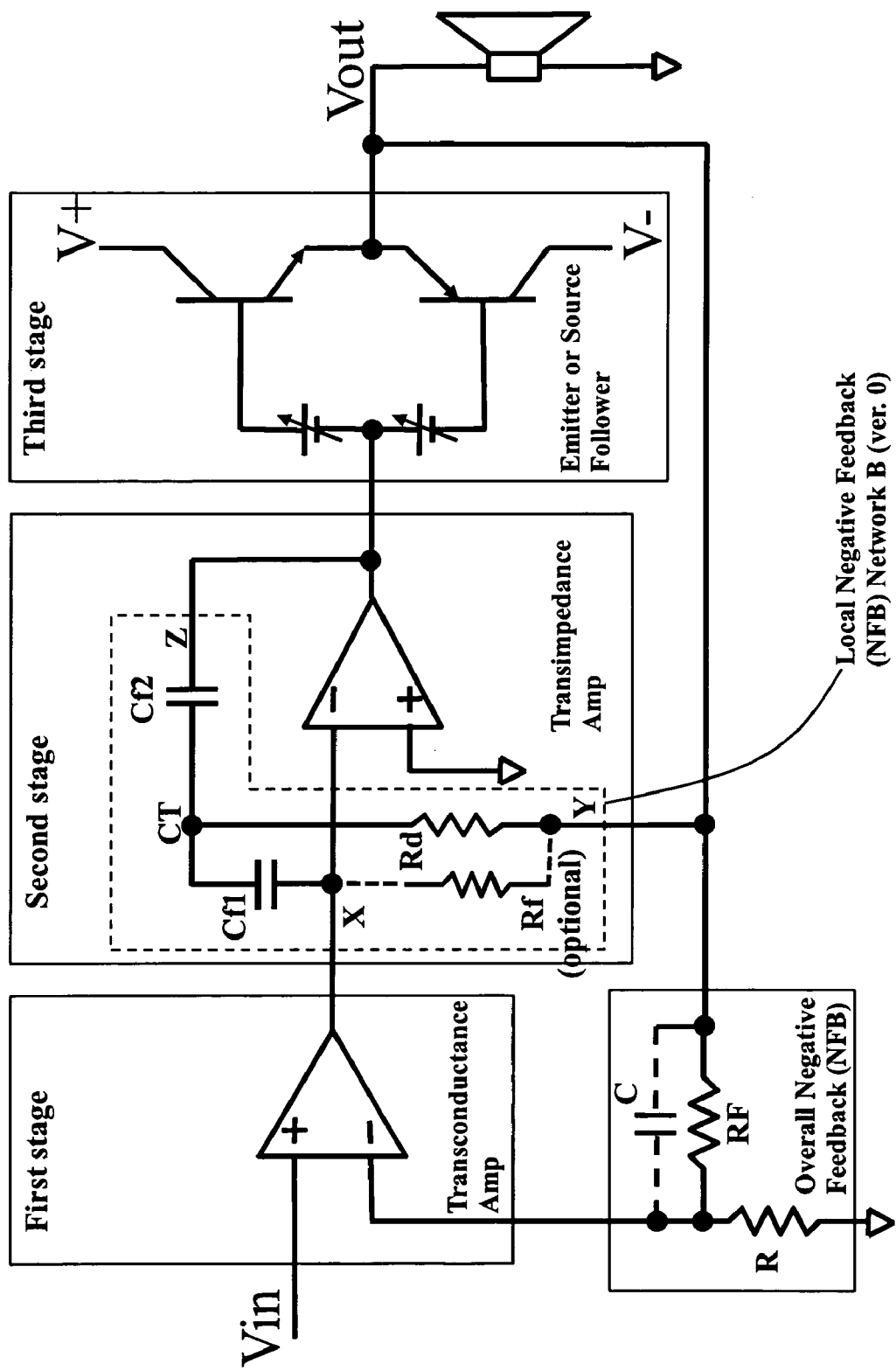
FIG. 6 is a block diagram illustrating the configuration of the power amplifier with the first variant of the second preferred local NFB network (Network B, Ver.0) of the present invention.
Figure 7:
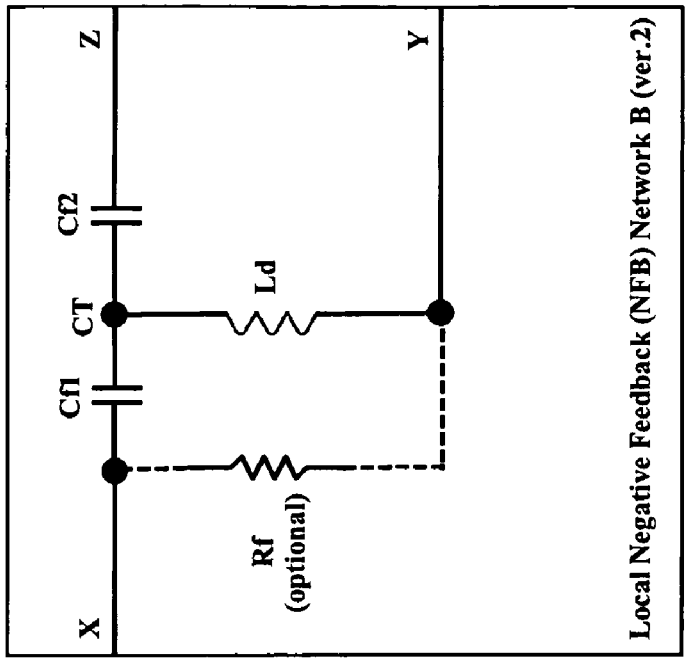
FIG. 7 is a schematic illustrating the two variants of configuration of the second preferred local NFB network (Network B, Ver.1 & Ver.2) of the present invention.
Figure 7:
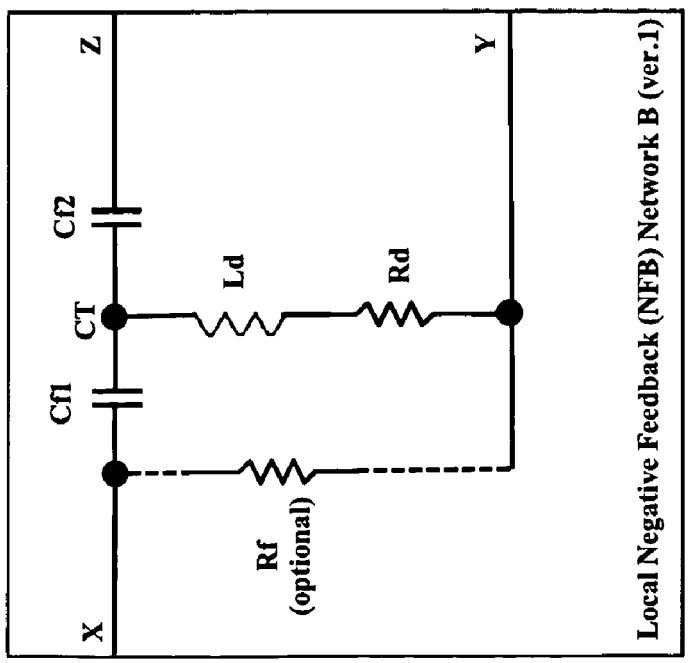

In some cases, we find that the new local NFB network A could cause high frequency parasitic oscillation in some real circuits. However, the oscillation won't occur if we change the local NFB network back to traditional Miller compensation while keeping all the other parts of the circuit unchanged. This happens especially when the second and the third stage amplifying modules included NFB loop has a bigger loop gain, either because the two-stage-included circuit has a high gain, the compensation capacitor is relatively big, or because of both. In order to solve this problem, a second preferred local NFB network, denominated as local Negative Feedback (NFB) network B, is disclosed in the present invention to achieve the same performance improvement as the local NFB network A can gain over traditional Miller compensation, while retaining virtually the same stability as traditional Miller compensation provides. The first preferred variant (ver.0) of the second preferred local NFB network circuit configuration is shown in FIG. 6, in which the topology of a power amplifier which utilizes this new local NFB network is also illustrated. The local NFB network B is intended to provide a feedback-shifting mechanization (as disclosed in more details below), capable of realizing the desired two-stage-included local NFB network from low frequency to a sufficiently high frequency point which is well above the application frequency band and then shifting back to traditional Miller compensation at even higher frequencies. In other words, the local NFB signal of the local NFB network B is mostly formed by the output signal of the third stage amplifying module from low frequency to a sufficiently high frequency point which is well above the application frequency band, while the local NFB signal of the local NFB network B is mainly formed by the output signal of the second stage amplifying module at even higher frequencies. The second and third preferred variants of local NFB network B (ver.1 and Ver.2) are illustrated in FIG. 7. It should be noted that other configuration of local NFB network can be used in the practice of realizing the feedback-shifting feature and the present invention is not limited to the specific configurations of the local NFB network B described herein as preferred embodiments.

As illustrated in FIG. 6 and FIG. 7, the preferred embodiment of the local NFB network B is a three-terminal T type network. The three terminals are denominated as X, Y and Z, and the center point is denominated as CT. As disclosed above, the three-terminal T type network can have three alternative configurations to form the three preferred variants as follows: comprising two capacitors and one resister as denominated as ver.0; comprising two capacitors, one inductor and one resistor as denominated as ver.1; and comprising two capacitors and one inductor as denominated as ver.2. All three configurations can also be augmented with an optional resister between node X and node Y as shown in FIG. 6 and FIG. 7. The X node is connected to the input of the second stage amplifying module, the Y node is connected to the output of the third stage amplifying module and the Z node is connected to the output node of the second stage amplifying module. The network consists of two feedback paths: the Y-CT-X path, which provides a feedback between Y and X and the Z-CT-X path, which offers a feedback between Z and X. The first feedback provides the desired two-stage-included local feedback between the second and the third stage amplifying modules, while the second feedback provides the traditional Miller compensation which possesses proven stability performance.

The essential characteristic of the local NFB network B is 'feedback-shifting' mechanization: for the frequency band from low to a certain high frequency point which well covers the application frequency band, for example, at a frequency point of 500 kHz, which well covers the 20 Hz-20 KHz audio band, the two-stage-included local feedback plays a dominant role and the Miller compensation is ignorable, and then at higher frequencies above this frequency point, the two-stage-included feedback fades away and the Miller compensation gradually shifts back and dominates the whole feedback and the network behaves more of the way a traditional Miller compensation does at the very high frequency band. Through this feedback-shifting technology, we not only get the benefit of the second and third stage amplifying module included local feedback, but also retain virtually the same superior stability traditional Miller compensation provides. Such a preferable characteristic can be achieved by properly setting the parameters of the components inside the network. Referring to FIG. 6, since the third stage amplifying module is usually an emitter/source follower and its voltage gain is 1, the node Y and node Z are at the same ac voltage level over a wide frequency range up to the very high frequency point where the emitter/source follower fails to follow its input which is usually at several 10s of MHz. Based on this fact and the other truth that the two feedback paths meet at the center point, CT, we deduce that the ratio of the feedback current through the Y-CT-X path over the feedback current through the Z-CT-X path is simply equal to the ratio of the conductance of the Y-CT path over the conductance of the Z-CT path. If we set the Y-CT path to have high conductance at low frequencies but have low conductance at high frequencies, or just have constant conductance over all the frequency range while setting the Z-CT path to have low conductance at low frequencies but have high conductance at high frequency, as a result, the three-terminal T type network will possess the desired feedback-shifting feature which retains the advantages of both the two-stage-included local feedback and the traditional Miller compensation.

The parameters of the components in the local NFB network B can be determined as follows: Firstly, set the capacitance of the Cf1 to be slightly bigger than the value when a traditional Miller compensation is used, usually it is 10s of PF to 100 PF. Secondly, set the time constant formed by Rd and Cf2 for ver.0, or the time constant formed by Ld and Cf2 for ver.1 and ver.2, that the associated frequency of this time constant is bigger than 10 times or more of the highest desired frequency, usually 200 kHz to several MHz for audio amplifier. Thirdly, choose the value of Cf2 to be several times bigger than the value of Cf1 and also assure Cf1//Cf2 (the combined value of Cf1 and Cf2 in parallel) is equal to the value when a traditional Miller compensation is implemented. The Cf2 value is usually in the range of 20 PF to 500 PF. Fourthly, we are now able to derive the value of Rd for ver.0, or Ld for ver.1 and ver.2. The value of Rd can be chosen from 100Ω to 10 kΩ, and the value of Ld can be set from 10s of uH to several mH. The smaller value the Rd or the Ld, the better the performance improvement but the less stable the circuit, and vice versa. Fifthly, we need to decide the value of Rd for ver.1. The Rd is a supplemental part of Ld in ver.1 and can be set to several Ω to several kΩ. Sixthly and lastly, we need to choose the value for the optional Rf. The Rf provides a local dc feedback over the second and the third stage amplifying modules and its value doesn't affect the stability characteristic but directly affect the open loop dc gain of the amplifier: Open-loop dc gain=first-stage trans-conductance× Rf. When a big open loop gain is not preferable then the Rf can be used and its value can be chosen according to the dc gain requirement.

The following design examples #3, #4, and #5 are summarized to demonstrate the applications of the second preferred local NFB network of the present invention. It should be noted that other configurations of the three-stage amplifying modules can be used in the practice of the second preferred local NFB network of the present invention and the present invention is not limited to the specific configurations of the three-stage amplifying modules described herein as preferred embodiments.

EXAMPLE #3

Figure 9:
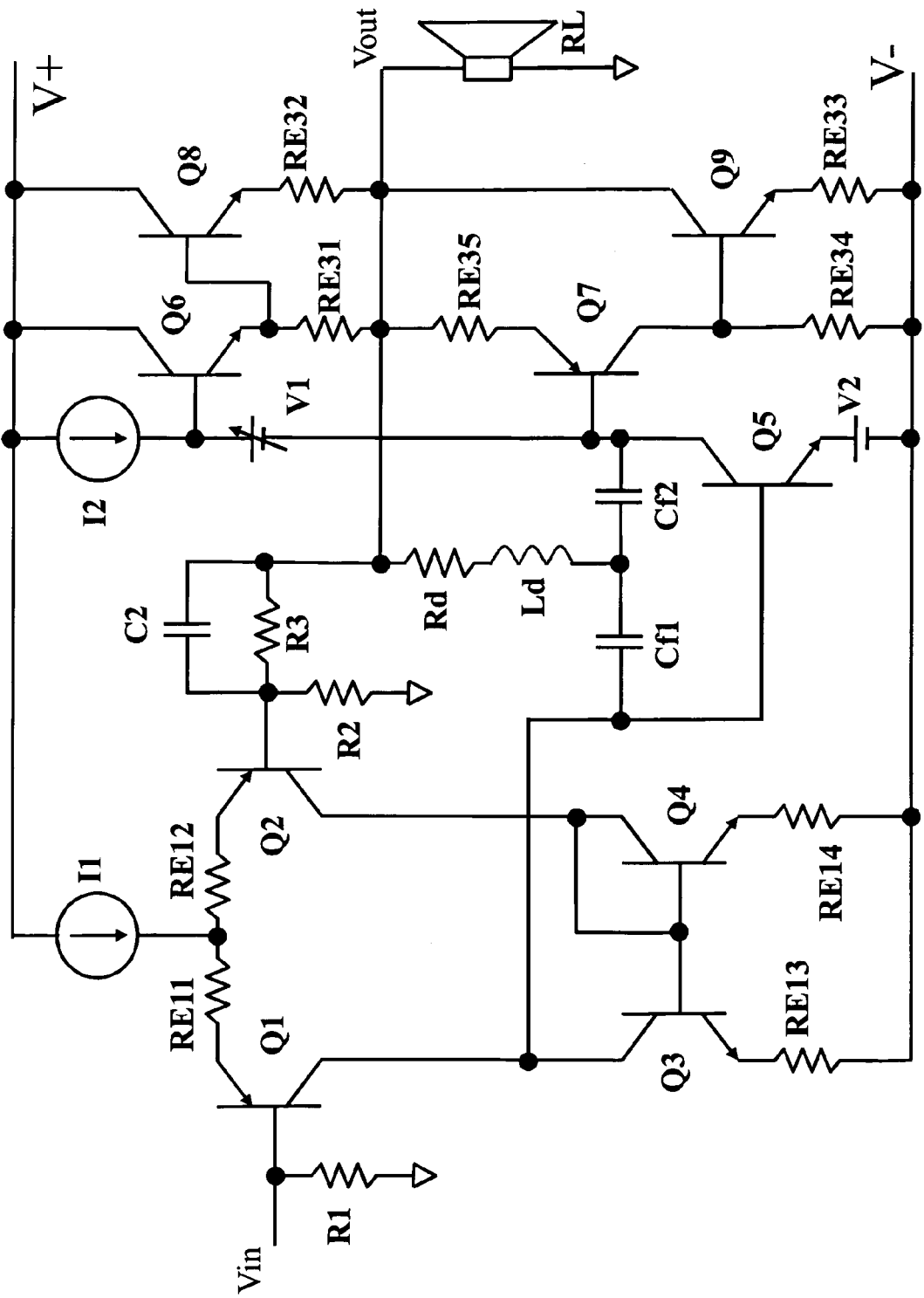
FIG. 9 is a schematic illustrating a basic power amplifier with the second variant of the second preferred local NFB network (Network B, Ver.1) according to another preferred embodiment of the present invention.

A power amplifier, as shown in FIG. 9, comprises a traditional three stage configuration with overall NFB and has a local NFB network which replaces the conventional Miller compensation, as follows:

(1) The first stage amplifying module is a differential trans-conductance amplifier which has two voltage input nodes and one current output node and consists of a common-emitter configured transistor pair, Q1 and Q2, two local feedback resisters, RE11 and RE12, a current source, I1, a current mirror configured transistor pair, Q3 and Q4, and the associated emitter resister pair, RE13 and RE14.

(2) The second stage amplifying module is a common-emitter configured single transistor trans-impedance amplifier which has its input node connected to the output node of the first stage amplifying module and its output node connected to the input node of the third stage amplifying module and consists of a transistor, Q5, a voltage shift device V2 which could be a Zener diode, a general purpose diode or a diode-configured transistor, and a current source, I2.

(3) The third stage amplifying module is a Darlington configured quasi-complementary emitter-follower pair which has its input nodes connected to the output node of the second stage amplifying module and its output node to be the output node of the whole amplifier and drive a load and consists of a Darlington transistor pair, Q6/Q8 and Q7/Q9, a bias voltage generator, V1, four emitter resistors, RE31, RE32, RE33 and RE35, and one bias resistor for Q9, RE34.

(4) A local NFB network B (ver.1) is inserted between the input of the second stage amplifying module, the output of the third stage amplifying module and the output of the second stage amplifying module which is comprised of one resistor, Rd, one inductor, Ld, and two capacitors, Cf1 and Cf2.

(5) An overall NFB network is inserted between the negative input of the first stage amplifying module and the output of the third stage amplifying module which is comprised of two resistors, R2 and R3, connected in serial, and a capacitor, C2, connected in parallel with R3.

EXAMPLE #4

Figure 11:
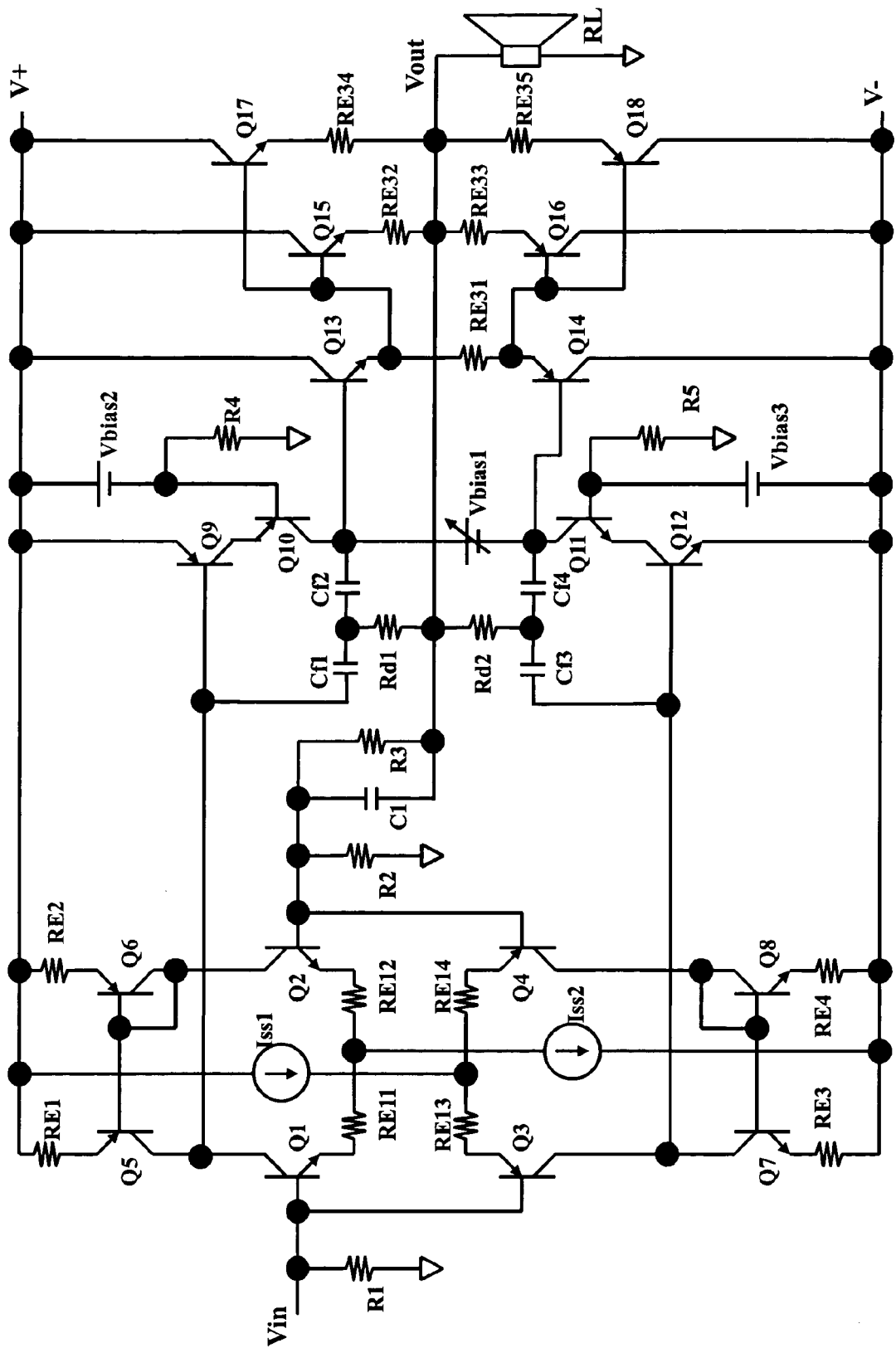
FIG. 11 is a schematic illustrating a fully complimentary power amplifier with the first variant of the second preferred local NFB network (Network B, Ver.0) according to another preferred embodiment of the present invention.

A power amplifier, as shown in FIG. 11, comprises a fully complimentary three stage configuration with overall NFB and has a local NFB network which replaces the conventional Miller compensation, as follows:

(1) The first stage amplifying module is a complimentary differential trans-conductance amplifier which has two voltage input nodes and two complimentary current output nodes and consists of two complimentary common-emitter configured transistor pairs, Q1/Q2 and Q3/Q4, two local feedback resister pairs, RE11/RE12 and RE13/RE14, two complimentary current sources, Iss1 and Iss2, two complimentary current mirror configured transistor pairs, Q5/Q6 and Q7/Q8, and two emitter resister pairs, RE1/RE2 and RE3/RE4.

(2) The second stage amplifying module is two complimentary cascaded common-emitter common-base transistor pairs to configure a trans-impedance amplifier which has its two complimentary inputs connected to the two complimentary outputs of the first stage amplifying module and its two complimentary outputs connected to the input nodes of the third stage amplifying module and consists of two complimentary transistor pairs, Q9/Q10 and Q11/Q12, and the bias circuits comprising of Vbias2 and Vbias3, which could be Zener diodes, general purpose diodes or diode-configured transistors, and two resisters, R4 and R5.

(3) The third stage amplifying module is two consecutively connected emitter-follower pairs which has its input nodes connected to the output nodes of the second stage amplifying module and its output node to be the output node of the whole amplifier and drive a load and consists of one complimentary driver transistor pair, Q13/Q14, two complimentary output transistor pairs in parallel, Q15/Q16 and Q17/Q18, a bias voltage generator, Vbias1, and five emitter resistors, RE31, RE32, RE33, RE35 and RE36.

(4) A pair of local NFB network B (ver.0) are inserted between the complimentary inputs of the second stage amplifying module, the complimentary outputs of the second stage amplifying module and the output of the third stage amplifying module and each network is comprised of two capacitors and one resister, as denoted as Cf1, Cf2 and Rd1 in one network and Cf3, Cf4 and Rd2 in the other network.

(5) An overall NFB network is inserted between the negative input of the first stage amplifying module and the output of the third stage amplifying module which is comprised of two resistors, R2 and R3, connected in serial, and a capacitor, C1, connected in parallel with R3.

EXAMPLE #5

Figure 12:
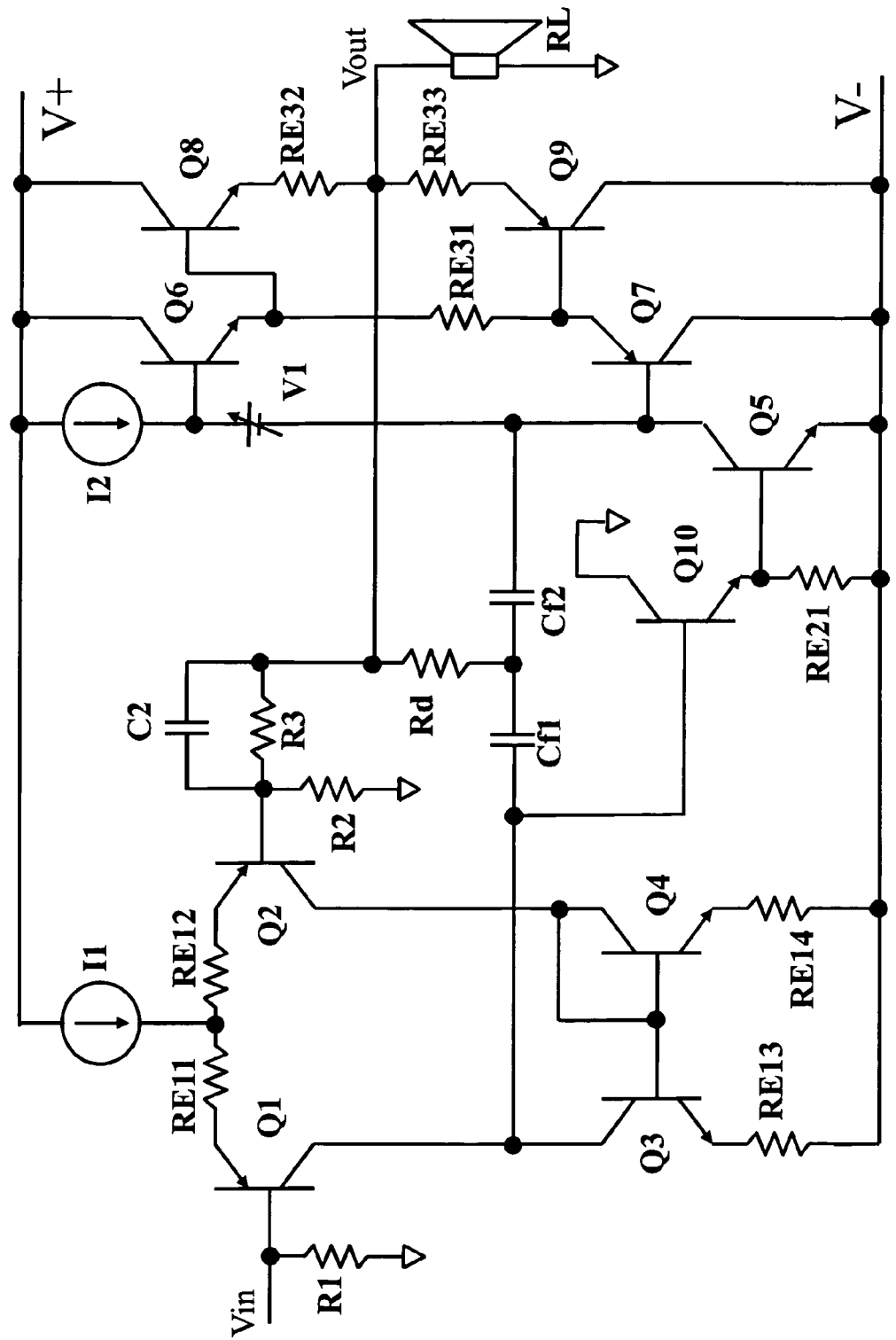
FIG. 12 a schematic illustrating a power amplifier with the first variant of the second preferred local NFB network (Network B, Ver.0) according to another preferred embodiment of the present invention.

A power amplifier, as shown in FIG. 12, comprises a three stage configuration with overall NFB and has a local NFB network which replaces the conventional Miller compensation, as follows:
(1) The first stage amplifying module is a differential transconductance amplifier which has two voltage input nodes and one current output node and consists of a common-emitter configured transistor pair, Q1 and Q2, two local feedback resistors, RE11 and RE12, a current source, I1, a current mirror configured transistor pair, Q3 and Q4, and the associated emitter resister pair, RE13 and RE14.
(2) The second stage amplifying module is a Darlington configured trans-impedance amplifier which has its input node connected to the output node of the first stage amplifying module and its output node connected to the input node of the third stage amplifying module and consists of two transistors, Q10 and Q5, an emitter resistor, R21, and a current source, I2.
(3) The third stage amplifying module is two consecutively connected emitter-follower pairs which has its input nodes connected to the output node of the second stage amplifying module and its output node to be the output node of the whole amplifier and drive a load and consists of two complimentary transistor pairs, Q6/Q7 and Q8/Q9, a bias voltage generator, V1, and three emitter resistors, RE31, RE32 and RE33.
(4) A local NFB network B (ver.0) is inserted between the input of the second stage amplifying module, the output of the third stage amplifying module and the output of the second stage amplifying module which is comprised of one resistor, Rd, and two capacitors, Cf1 and Cf2.
(5) An overall NFB network is inserted between the negative input of the first stage amplifying module and the output of the third stage amplifying module which is comprised of two resistors, R2 and R3, connected in serial, and a capacitor, C2, connected in parallel with R3.

Figure 13:
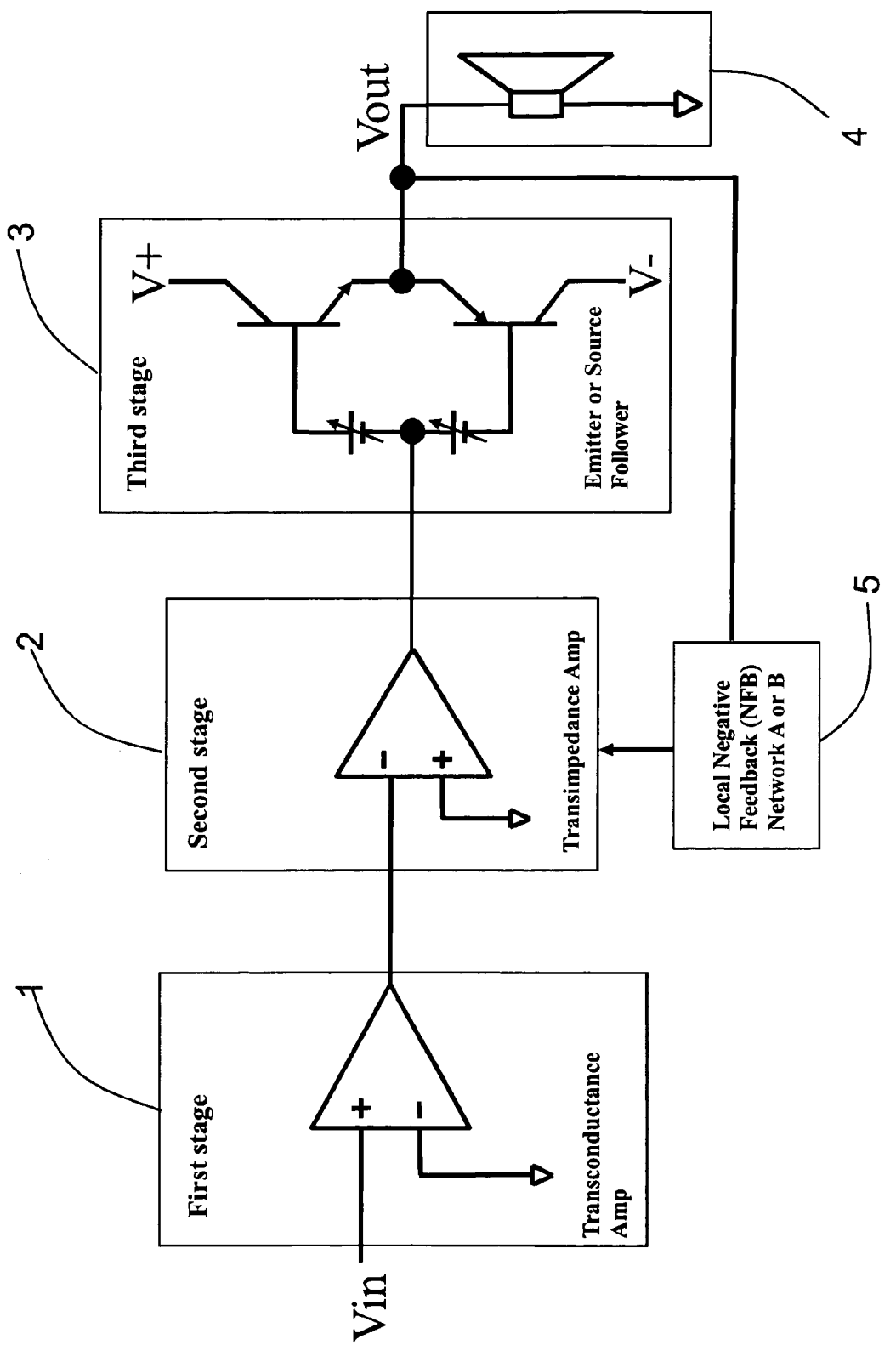
FIG. 13 is a block diagram illustrating a non-overall NFB amplifier with either one of the two preferred local NFB networks (Network A or Network B) according to a preferred alternative embodiment of the present invention.

Since now the overall NFB can be safely replaced by local NFB without significant performance degradation in the present invention, an elegant design with this technique would be a NON-OVERALL-NFB amplifier as mentioned before. A NON-OVERALL-NFB amplifier of the present invention does not have overall NFB but still achieves very high performance with great simplicity and at low cost, not like other NON-OVERALL-NFB designs which inevitably have to bias the last stage amplifying module at Class A to achieve decent performance. Referring to FIG. 13, another alternative embodiment of a power amplifier of the present invention which discloses a configuration of a NON-Overall-NFB power amplifier comprises:
(1) A first-stage amplifying module 1, which serves as a local trans-conductance amplifier, receiving a voltage signal from an external audio signal source as input and providing current as output;
(2) A second stage amplifying module 2, which is a local trans-impedance amplifier, receiving the current output from the first-stage amplifying module 1 and outputting voltage signal, wherein the second-stage amplifying module 2 also receives a signal from a local NFB network 5 that are connected between the input node of the second-stage amplifying module 2 and the output node of a third-stage amplifying module 3. The NFB from local NFB network 5 suppresses the dominant distortion that is generated by both the second and the third-stage amplifying module 3 while maintaining the stability of the entire amplifier; and
(3) The third stage amplifying module, which is a unity gain voltage follower and could be emitter or source follower pair, or Darlington transistor pair, to provides current gain and acts as the output stage of the entire power amplifier to drive a load 4.

In a NON-OVERALL-NFB power amplifier of the present invention disclosed above, the local NFB network 5 can be formed with all preferred embodiments of the local network that are disclosed for the power amplifiers with overall NFB.

The following design examples #6 are summarized to demonstrate the NON-OVERALL-NFB designs of the present invention. This typical NON-OVERALL-NFB power amplifier utilizing the new technique of the present invention can achieve 0.01% distortion over frequency range from 20 Hz to 20 KHz at output power from 0.5 Watt to 80 Watt with the output stage biased with only 60 mA (based on simulation). It should be noted that other configurations of the three-stage amplifying modules can be used in the practice of the NON-OVERALL-NFB designs of the present invention and the present invention is not limited to the specific configurations of the three-stage amplifying modules described herein as preferred embodiments.

EXAMPLE 6

Figure 14:
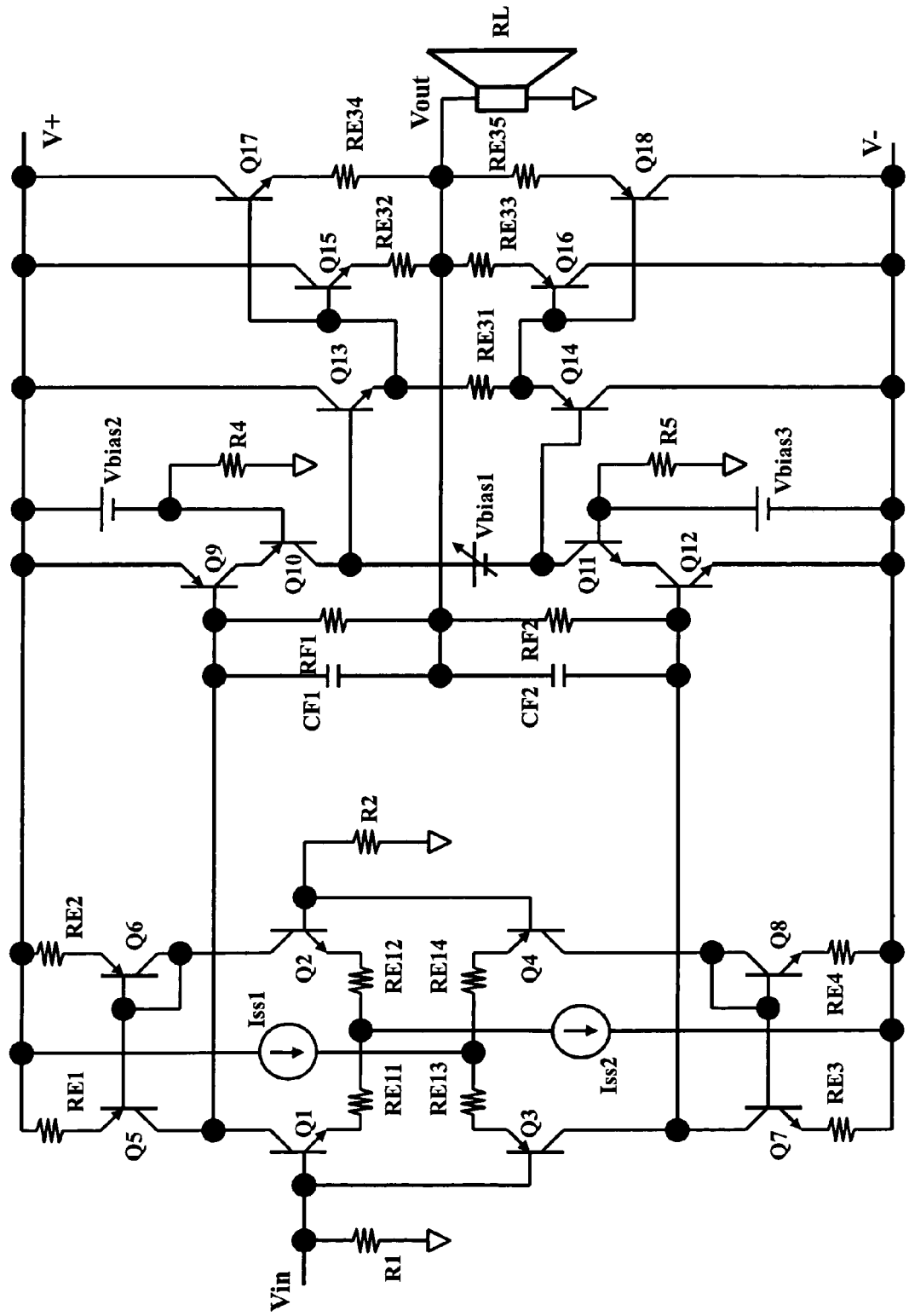
FIG. 14 is a schematic illustrating a non-overall NFB power amplifier with the first preferred local NFB network (Network A) according to another preferred alternative embodiment of the present invention

A power amplifier, as shown in FIG. 14, comprises a fully complimentary three stage configuration without overall NFB and has a local NFB network which replaces the conventional Miller compensation, as follows:
(1) The first stage amplifying module is a complimentary differential trans-conductance amplifier which has two voltage input nodes and two complimentary current output nodes and consists of two complimentary common-emitter configured transistor pairs, Q1/Q2 and Q3/Q4, two local feedback resister pairs, RE11/RE12 and RE13/RE14, two complimentary current sources, Iss1 and Iss2, two complimentary current mirror configured transistor pairs, Q5/Q6 and Q7/Q8, and two emitter resister pairs, RE1/RE2 and RE3/RE4.
(2) The second stage amplifying module is two complimentary cascaded common-emitter common-base transistor pairs to configure a trans-impedance amplifier which has its two complimentary inputs connected to the two complimentary outputs of the first stage amplifying module and its two complimentary outputs connected to the input nodes of the third stage amplifying module and consists of two complimentary transistor pairs, Q9/Q10 and Q11/Q12, and the bias circuits comprising of Vbias2 and Vbias3, which could be Zener diodes, general purpose diodes or diode-configured transistors, and two resisters, R4 and R5.
(3) The third stage amplifying module is two consecutively connected emitter-follower pairs which has its input nodes connected to the output nodes of the second stage amplifying module and its output node to be the output node of the whole amplifier and drive a load and consists of one complimentary driver transistor pair, Q13/Q14, two complimentary output transistor pairs in parallel, Q15/Q16 and Q17/Q18, a bias voltage generator, Vbias1, and five emitter resistors, RE31, RE32, RE33, RE35 and RE36.
(4) A complimentary pair of local NFB network A is inserted between the complimentary inputs of the second stage amplifying module and the output of the third stage amplifying module and each network is comprised of one resister and one capacitor in parallel, as denoted as RF1 and CF1 in the upper network and RF2 and CF2 in the lower network.

The advantages of the two-stage-included local feedback over the traditional Miller compensation are summarized as follows. Refer to the sample of the power amplifier circuit as shown in FIG. 11, which is a fully complimentary design which implements the new local NFB network B (Ver.0). The power transistor pairs at the output stage ($Q_{15}/Q_{16}$, $Q_{17}/Q_{18}$) are biased with totally 50 mA. This bias current is very low for a high quality 100 Watt audio power amplifier. Furthermore, since the local two-stage-included NFB of the present invention could greatly suppress distortion caused by the second and third stage amplifying modules, the bias current is much less important as compared to conventional Miller compensation and the amplifier's performance hardly changes even if we further reduce it to 25 mA. This is a highly appreciated feature for practical amplifier design since the thermal design of a high quality power amplifier is quite challenging because the bias current variation has to be kept in a small range so that the claimed performance can be guaranteed. The two-stage-included NFB technology of the present invention can make power amplifier thermal design greatly relaxed. Based on simulation, this circuit can achieve a Total Harmonic Distortion (THD) lower than 0.001% for a frequency range from 10 Hz to 20 kHz and at the output level from 0.5 Watt to 100 Watt, compared to a 0.01% THD over the same frequency and output range if the traditional Miller compensation is used while all the other circuits and the bias current are kept the same. On the other hand, even if we change the output stage amplifying module to be biased at Class A, the circuit still can't achieve 0.001% THD when the Miller compensation is implemented. And more important than the distortion number itself, the distortion spectrum of the two-stage-included local NFB of the present invention has much fewer high order harmonic components as compared to the distortion spectrum of the same circuit with traditional Miller compensation. This is also highly preferred since it further helps improve amplifier's subjective listening impression which is very important for commercial product. The two-stage-included NFB of the present invention has an even desirable characteristic that it contradicts the traditional Miller compensation by showing lower distortion at lower output level. This is simply because class B/AB amplifiers' distortion at low output level is completely dominated by the output stage crossover distortion, a specific situation for the two-stage-included NFB to shows its power. A power amplifier with the new local NFB of the present invention also has lower output impedance and hence its performance is less load dependent at high frequency as compared to traditional Miller compensation and this fact is also preferable since the load of an audio power amplifier is usually a speaker system which not only has a complicated combination of RLC components but also the parameters of each components are hard to predict, not to mention they vary greatly from manufacture to manufacture.

Since the two-stage-included NFB loop of the present invention simply replaces the traditional Miller compensation without altering other parts of the circuit, it can be implemented in almost all three-stage power amplifier designs to greatly improve their performance without requiring major design modification. This is especially true when the local NFB network B is considered for the implementation, because of the feedback-shifting mechanism it possesses. The local NFB network B can be directly used to replace the Miller compensation in almost every existing power amplifier design with virtually no modifying of the circuit. Furthermore, the local negative feedback technologies of the present inventions discloses cost-effective and power-effective approaches of performance improvements for the person having ordinary skill in the art to implement in a wide range of electronic amplifiers with multiple amplifying stages.

What is claimed is:

1. An amplifier for making an input signal stronger, either manufactured in a printed circuit board (PCB) or an integrated circuit (IC) chip, comprising:
    a first stage amplifying module, which serves as a local trans-conductance amplifier, receiving a voltage signal from an external signal source as input and generating a current signal output;
    a second stage amplifying module, which serves as a local trans-impedance amplifier, receiving said current signal output from said first-stage amplifying module and a local feedback signal from a local negative feedback network, and outputting an amplified voltage signal;
    a third stage amplifying module, which serves as a voltage follower to provide current gain and acts as an output stage of said amplifier, receiving said amplified voltage output from said second stage amplifier and outputting final amplified signal with enough voltage and current amplitude to drive a load;
    said local negative feedback network, which are connected between input node of said second-stage amplifying module and output node of said third-stage amplifying module, receiving said final amplified signal of said third stage amplifying module, suppressing distortion that is generated by both said second-stage amplifying module and said third-stage amplifying module, and maintaining stability of said amplifier; and
    wherein said first stage amplifying module further receives an overall negative feedback signal from an overall negative feedback network which is connected between input node of said first-stage amplifying module and said output node of said third stage amplifying module and receives said final amplified signal of said third stage amplifying module, for further improving overall performance of said amplifier.

2. An amplifier for making an input signal stronger, either manufactured in a printed circuit board (PCB) or an integrated circuit (IC) chip, comprising:
    a first stage amplifying module, which serves as a local trans-conductance amplifier, receiving a voltage signal from an external signal source as input and generating a current signal output;
    a second stage amplifying module, which serves as a local trans-impedance amplifier, receiving said current signal output from said first-stage amplifying module and a local feedback signal from a local negative feedback network, and outputting an amplified voltage signal;
    a third stage amplifying module, which serves as a voltage follower to provide current gain and acts as an output stage of said amplifier, receiving said amplified voltage output from said second stage amplifier and outputting final amplified signal with enough voltage and current amplitude to drive a load;
    said local negative feedback network, which are connected between input node of said second-stage amplifying module and output node of said third-stage amplifying module, receiving said final amplified signal of said third stage amplifying module, suppressing distortion that is generated by both said second-stage amplifying module and said third-stage amplifying module, and maintaining stability of said amplifier; and wherein said local negative feedback network is a RC network formed with capacitors and resistors.

3. An amplifier, as recited in claim 2, wherein said local negative feedback network includes a capacitor and an optional resistor which are connected in parallel between said input node of said second-stage amplifying module and said output node of said third-stage amplifying module.

4. An amplifier for making an input signal stronger. either manufactured in a printed circuit board (PCB) or an integrated circuit (IC) chip, comprising:
   a first stage amplifying module, which serves as a local trans-conductance amplifier, receiving a voltage signal from an external signal source as input and generating a current signal output;
   a second stage amplifying module, which serves as a local trans-impedance amplifier, receiving said current signal output from said first-stage amplifying module and a local feedback signal from a local negative feedback network, and outputting an amplified voltage signal;
   a third stage amplifying module, which serves as a voltage follower to provide current gain and acts as an output stage of said amplifier, receiving said amplified voltage output from said second stage amplifier and outputting final amplified signal with enough voltage and current amplitude to drive a load;
   said local negative feedback network, which are connected between input node of said second-stage amplifying module and output node of said third-stage amplifying module, receiving said final amplified signal of said third stage amplifying module, suppressing distortion that is generated by both said second-stage amplifying module and said third-stage amplifying module, and maintaining stability of said amplifier; and
   wherein said local negative feedback network further picks up said amplified voltage output of said second stage amplifying module to improve performance of maintaining stability and suppressing distortion for said amplifier.

5. An amplifier, as recited in claim 4, wherein said local negative feedback network is formed to generate said local feedback signal mainly responding to said final amplified signal of said third stage amplifying module from a low frequency to a high frequency point which is well above said amplifier's application frequency band so that said local negative feedback network effectively covers both said second-stage amplifying module and said third-stage amplifying module from said low frequency to said high frequency point, and to generate said local feedback signal mainly responding to said amplified voltage output of said second stage amplifying module at even higher frequencies than said high frequency point so that said local negative feedback network actually shifts back to serve as a traditional Miller compensation role covering said second-stage amplifying module only at even higher frequencies than said high frequency point.

6. An amplifier, as recited in claim 5, wherein said local negative feedback network is formed with a three-terminal T type network, wherein said three terminals are denominated as X, Y and Z, and a center point is denominated as CT; said terminal X node is connected to said input node of said second stage amplifying module, said terminal Y node is connected to said output node of said third stage, and said terminal Z node is connected to said output node of said second stage; Y-CT-X feedback path provides a feedback between Y and X, and Z-CT-X path sets feedback between Z and X; and said Y-CT-X feedback provides desired local feedback between said second and said third stage amplifying modules, while said Z-CT-X path provides traditional Miller compensation which covers said second stage only, wherein said Y-CT-X feedback dominates in combined feedbacks of said Y-CT-X feedback and said Z-CT-X feedback from said low frequency to said high frequency point, while said Z-CT-X feedback dominates in combined feedbacks of said Y-CT-X feedback and said Z-CT-X feedback at even higher frequencies than said high frequency point.

7. An amplifier, as recited in claims 6, wherein a resistor is further connected between said X and said Y terminals.

8. An amplifier, as recited in claim 6, wherein said three-terminal T type network is formed with a RCC (resistor-capacitor-capacitor) configuration which comprises:
   a. said Y terminal, including a resistor which is connected with said output node of said third stage amplifying module and said CT point;
   b. said X terminal, including first capacitor which is connected with said input node of said second stage amplifying module and said CT point; and
   c. said Z terminal, including second capacitor which is connected with said output node of second stage amplifying module and said CT point.

9. An amplifier, as recited in claim 6, wherein said three-terminals T type network is formed with a RCCL(resistor-capacitor-capacitor-inductor) configuration which comprises:
   a. said Y terminal, including a resistor which is connected with said output node of said third stage amplifying module and said CT point through an inductor in series;
   b. said X terminal, including first capacitor which is connected with said input of said second stage amplifying module and said CT point; and
   c. said Z terminal, including second capacitor which is connected with said output node of second stage amplifying module and said CT point.

10. An amplifier, as recited in claim 6, wherein said three-terminal T type network is formed with a CCL(capacitor-capacitor-inductor) configuration which comprises:
    a. said Y terminal, including an inductor which is connected with said output node of said third stage amplifying module and said CT point;
    b. said X terminal, including first capacitor which is connected with said input node of said second stage amplifying module and said CT point; and
    c. said Z terminal, including second capacitor which is connected with said output node of second stage amplifying module and said CT point.

11. An amplifier, as recited in claims 1, wherein said local negative feedback network is a RC network formed with capacitors and resistors.

12. An amplifier, as recited in claim 11, wherein said local negative feedback network includes a capacitor and an optional resistor which are connected in parallel between said input node of said second-stage amplifying module and said output node of said third-stage amplifying module.

13. An amplifier, as recited in claims 1, wherein said local negative feedback network further picks up said amplified voltage output of said second stage amplifying module to improve performance of maintaining stability and suppressing distortion for said amplifier.

14. An amplifier, as recited in claim 13, wherein said local negative feedback network is formed to generate said local feedback signal mainly responding to said final amplified signal of said third stage amplifying module from a low frequency to a high frequency point which is well above said amplifier's application frequency band so that said local negative feedback network effectively covers both said second-stage amplifying module and said third-stage amplifying module from said low frequency to said high frequency point, and to generate said local feedback signal mainly responding to said amplified voltage output of said second stage amplifying module at even higher frequencies than said high frequency point so that said local negative feedback network actually shifts back to serve as a traditional Miller compensation role covering said second-stage amplifying module only at even higher frequencies than said high frequency point.

15. An amplifier, as recited in claim 14, wherein said local negative feedback network is formed with a three-terminal T type network, wherein said three terminals are denominated as X, Y and Z, and a center point is denominated as CT; said terminal X node is connected to said input node of said second stage amplifying module, said terminal Y node is connected to said output node of said third stage, and said terminal Z node is connected to said output node of said second stage; Y-CT-X feedback path provides a feedback between Y and X, and Z-CT-X path sets feedback between Z and X; and said Y-CT-X feedback provides desired local feedback between said second and said third stage amplifying modules, while said Z-CT-X path provides traditional Miller compensation which covers said second stage only, wherein said Y-CT- X feedback dominates in combined feedbacks of said Y-CT-X feedback and said Z-CT-X feedback from said low frequency to said high frequency point, while said Z-CT-X feedback dominates in combined feedbacks of said Y-CT-X feedback and said Z-CT-X feedback at even higher frequencies than said high frequency point.

16. An amplifier, as recited in claims 15, wherein a resistor is further connected between said X and said Y terminals.

17. An amplifier, as recited in claim 15, wherein said three-terminal T type network is formed with a RCC (resistor-capacitor-capacitor) configuration which comprises:

a. said Y terminal, including a resistor which is connected with said output node of said third stage amplifying module and said CT point;
b. said X terminal, including first capacitor which is connected with said input node of said second stage amplifying module and said CT point; and
c. said Z terminal, including second capacitor which is connected with said output node of second stage amplifying module and said CT point.

18. An amplifier, as recited in claim 15, wherein said three-terminals T type network is formed with a RCCL(resistor-capacitor-capacitor-inductor) configuration which comprises:

a. said Y terminal, including a resistor which is connected with said output node of said third stage amplifying module and said CT point through an inductor in series;
b. said X terminal, including first capacitor which is connected with said input of said second stage amplifying module and said CT point; and
c. said Z terminal, including second capacitor which is connected with said output node of second stage amplifying module and said CT point.

19. An amplifier, as recited in claim 15, wherein said three-terminal T type network is formed with a CCL(capacitor-capacitor-inductor) configuration which comprises:

a. said Y terminal, including an inductor which is connected with said output node of said third stage amplifying module and said CT point;
b. said X terminal, including first capacitor which is connected with said input node of said second stage amplifying module and said CT point; and
c. said Z terminal, including second capacitor which is connected with said output node of second stage amplifying module and said CT point.

* * * * *